United States Patent
Yip (10) Patent No.: US 7,616,489 B2
(45) Date of Patent: Nov. 10, 2009

(54) MEMORY ARRAY SEGMENTATION AND METHODS

(75) Inventor: Aaron Yip, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 321 days.

(21) Appl. No.: 11/349,854

(22) Filed: Feb. 8, 2006

(65) Prior Publication Data

US 2007/0183202 A1    Aug. 9, 2007

(51) Int. Cl.
*G11C 16/04*    (2006.01)

(52) U.S. Cl. .............. 365/185.17; 365/185.18; 365/185.01; 365/63

(58) Field of Classification Search ......... 257/314–319, 257/E21.682; 365/185.17, 185.18, 185.01, 365/185.05, 63
See application file for complete search history.

(56) References Cited

U.S. PATENT DOCUMENTS

| | | | |
|---|---|---|---|
| 6,771,536 B2 | 8/2004 | Li et al. | |
| 6,847,087 B2 * | 1/2005 | Yang et al. | 257/390 |
| 7,075,140 B2 * | 7/2006 | Spadea | 257/315 |
| 7,212,434 B2 * | 5/2007 | Umezawa | 365/185.01 |
| 7,245,534 B2 * | 7/2007 | Goda et al. | 365/185.17 |
| 2002/0158282 A1 | 10/2002 | Li et al. | |
| 2005/0110073 A1 | 5/2005 | Spadea | |
| 2005/0174852 A1 | 8/2005 | Hemink | |

* cited by examiner

*Primary Examiner*—David Lam
(74) *Attorney, Agent, or Firm*—Leffert Jay & Polglaze, P.A.

(57) ABSTRACT

The invention provides methods and apparatus. A memory array has a first well region having a first conductivity type. A plurality of second well regions of a second conductivity type is formed in the first well region. The second well regions are electrically isolated from each other. A plurality of memory cells, arranged in row and column fashion, is formed on each second well region. Corresponding rows of memory cells of the respective second well regions are commonly coupled to a word line.

33 Claims, 4 Drawing Sheets

MEMORY ARRAY SEGMENTATION AND METHODS

TECHNICAL FIELD OF THE INVENTION

The present invention relates generally to memory devices and in particular the present invention relates to segmented memory arrays.

BACKGROUND OF THE INVENTION

Memory devices are typically provided as internal storage areas in computers. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as flash memory. A flash memory is a type of EEPROM (electrically-erasable programmable read-only memory) that can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed on an individual basis by charging the floating gate. The charge can be removed from the floating gate by a block erase operation. The data in a cell is determined by the presence or absence of the charge on the floating gate.

A NAND flash memory device is a common type of flash memory device, so called for the logical form the basic memory cell configuration. The control gate of each memory cell of a row of the array is connected to a word-select line. The memory cells of the array are arranged together in strings (often termed NAND strings), typically of 32 each, with the memory cells coupled together in series, source to drain, between a source line and a column bit line. The memory array for NAND flash memory devices is then accessed by a row decoder activating a row of memory cells by selecting the word-select line coupled to a control gate of a memory cell. In addition, the word-select lines coupled to the control gates of unselected memory cells of each string are driven to operate the unselected memory cells of each string as pass transistors, so that they pass current in a manner that is unrestricted by their stored data values. Current then flows from the source line to the column bit line through each series coupled string, restricted only by the selected memory cells of each string. This places the current-encoded data values of the row of selected memory cells on the column bit lines.

Sometimes a portion of the memory cells coupled to a selected word line is targeted for programming. This involves applying a programming voltage to the word line and thus to the control gate of each memory cell coupled to the selected word line, regardless of whether a memory cell is targeted or untargeted for programming. While the programming voltage is applied to the selected word line, a potential, such as a ground potential, is applied to the substrate on which the memory cells are formed and thus to the channels of these memory cells. This produces voltage differences that can disturb the threshold voltages Vt of the untargeted memory cells coupled to the selected word line and partially program these memory cells. This is commonly referred to as a programming-voltage disturbance (or stress). Successive programming operations may have a cumulative effect in that each programming operation partially programs the untargeted cells until the untargeted cells become programmed undesirably.

Moreover, a voltage that is not sufficient for programming the memory cells, typically referred to as a pass voltage, is applied to the remaining (or unselected) word lines to turn on the memory cells coupled to these word lines so that these memory cells can operate as pass transistors. The voltage difference between the pass voltage applied to the unselected word lines and the channels of the memory cells coupled to the unselected word lines can disturb the threshold voltages of these memory cells and partially program them. This is commonly referred to a pass-voltage disturbance (or stress). Successive applications of the pass voltage may have a cumulative effect in that each application partially programs the cells until they become programmed undesirably.

For the reasons stated above, and for other reasons stated below which will become apparent to those skilled in the art upon reading and understanding the present specification, there is a need in the art for alternative memory array structures and programming operations.

SUMMARY

The above-mentioned problems with memory devices and other problems are addressed by the present invention and will be understood by reading and studying the following specification.

For one embodiment, the invention provides a memory array, including a first well region having a first conductivity type, a plurality of second well regions of a second conductivity type formed in the first well region, the second well regions electrically isolated from each other, and a plurality of memory cells, arranged in row and column fashion, formed on each second well region. Corresponding rows of memory cells of the respective second well regions are commonly coupled to a word line.

Further embodiments of the invention include methods and apparatus of varying scope.

DETAILED DESCRIPTION

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Use the following if applicable: The term wafer or substrate used in the following description includes any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

Figure 1:
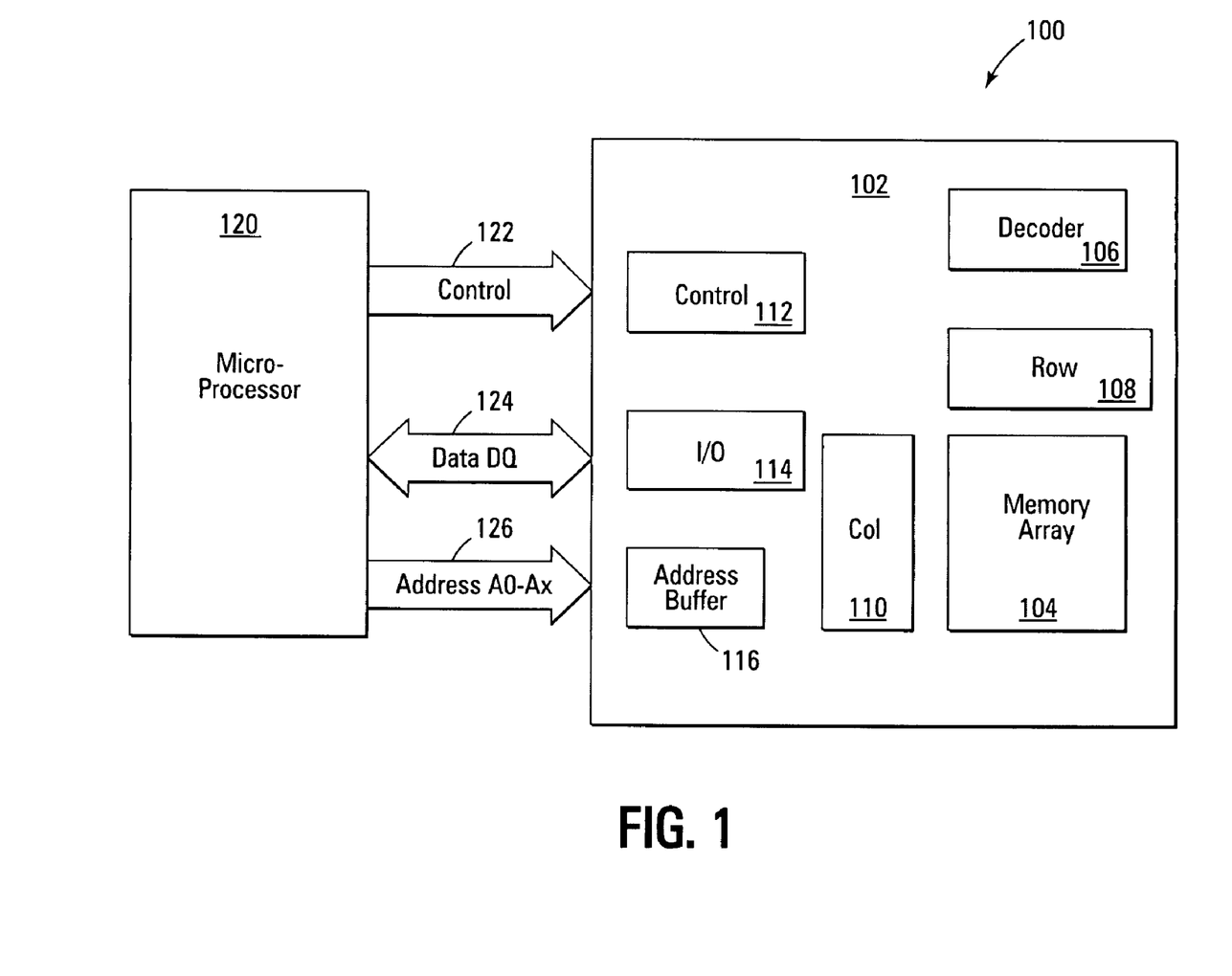
FIG. 1 is a block diagram illustration of an integrated circuit device, according to an embodiment of the invention.

FIG. 1 is a block diagram illustration of an integrated circuit device, such as a processor, a memory device 102, etc., according to an embodiment of the invention. The memory device 102 may be fabricated as semiconductor device on a semiconductor substrate.

For one embodiment, memory device 102 includes an array of flash memory cells 104, an address decoder 106, row access circuitry 108, column access circuitry 110, control circuitry 112, Input/Output (I/O) circuitry 114, and an address buffer 116. Column access circuitry 110 includes multiplexing circuitry in accordance with embodiments of the invention. Control circuitry 112 is adapted to perform operations of the invention.

Memory device 102 may be coupled an external microprocessor 120, or memory controller, for memory accessing as part of an electronic system. The memory device 102 receives control signals from the processor 120 over a control link 122. The memory cells are used to store data that are accessed via a data (DQ) link 124. Address signals are received via an address link 126 that are decoded at address decoder 106 to access the memory array 104. Address buffer circuit 116 latches the address signals. The memory cells are accessed in response to the control signals and the address signals.

The memory array 104 includes memory cells arranged in row and column fashion and having a NAND architecture. For one embodiment, each of the memory cells includes a floating-gate field-effect transistor capable of holding a charge. The cells may be grouped into blocks. Each of the cells within a block can be electrically programmed on an individual basis by charging the floating gate. The charge can be removed from the floating gate by a block erase operation. Memory array 104 is formed in accordance with embodiments of the invention. It will be appreciated by those skilled in the art that additional circuitry and control signals can be provided, and that the memory device of FIG. 1 has been simplified to help focus on the invention. Memory array 104 can further include other types of memory cells that can define a data value by a change in threshold voltage.

Figure 2:
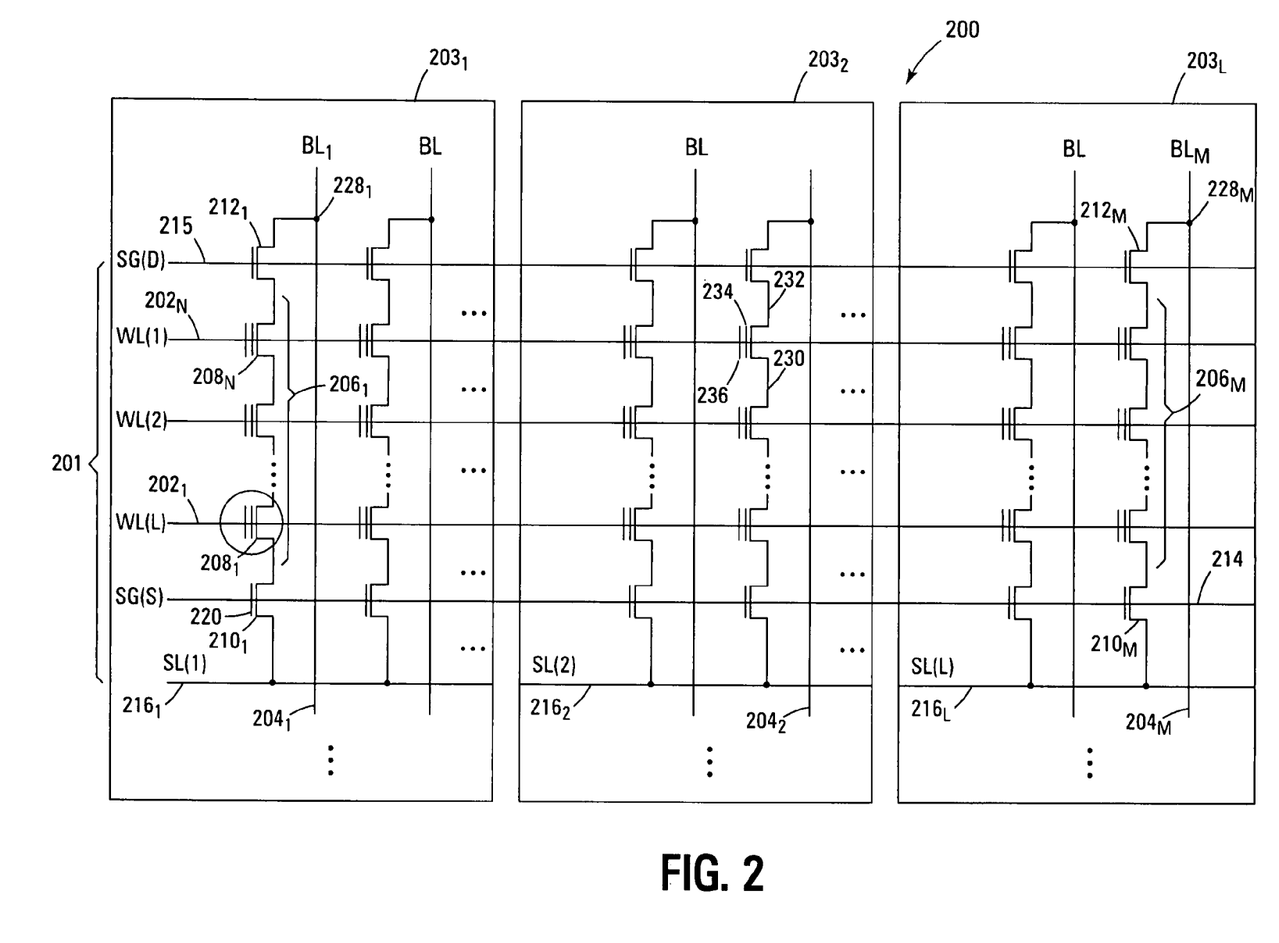
FIG. 2 illustrates a NAND memory array in accordance with another embodiment of the invention.

FIG. 2 illustrates a NAND memory array 200 as a portion of memory array 102 in accordance with another embodiment of the invention. For one embodiment, memory array 200 includes one or more memory blocks 201. For another embodiment, memory array includes memory sectors 203, each including portions of the one or more memory blocks 201.

As shown in FIG. 2, the memory array 200 includes word lines $202_1$ to $202_N$ and intersecting local bit lines $204_1$ to $204_M$. Memory array 200 includes NAND strings $206_1$ to $206_M$. Each NAND string includes floating gate transistors $208_1$ to $208_N$, each located at an intersection of a word line 202 and a local bit line 204. The floating gate transistors 208 represent non-volatile memory cells for storage of data. The floating gate transistors 208 of each NAND string 206 are connected in series, source to drain, between a source select gate 210, e.g., a field effect transistor (FET), and a drain select gate 212, e.g., an FET. Each source select gate 210 is located at an intersection of a local bit line 204 and a source select line 214, while each drain select gate 212 is located at an intersection of a local bit line 204 and a drain select line 215.

A source of each source select gate 210 of a sector 203 is connected to a common source line 216 for that sector 203. Note that a separate source line 216 is formed in each sector 203 and that source line 203 is electrically isolated from the other source lines 203. For example source lines $216_1$-$216_L$ are respectively formed in sectors $203_1$-$203_L$, as shown in FIG. 2. The drain of each source select gate 210 is connected to the source of the first floating gate transistor 208 of the corresponding NAND string 206. For example, the drain of source select gate $210_1$ is connected to the source of floating gate transistor $208_1$ of the corresponding NAND string $206_1$. A control gate 220 of each source select gate 210 is connected to source select line 214. It is common for a common source line to be connected between source select gates for NAND strings of two different NAND arrays. As such, the two NAND arrays share the common source line.

The drain of each drain select gate 212 is connected to the local bit line 204 for the corresponding NAND string at a drain contact 228. For example, the drain of drain select gate $212_1$ is connected to the local bit line $204_1$ for the corresponding NAND string $206_1$ at drain contact $228_1$. The source of each drain select gate 212 is connected to the drain of the last floating gate transistor $208_N$ of the corresponding NAND string 206. For example, the source of drain select gate $212_1$ is connected to the drain of floating gate transistor $208_N$ of the corresponding NAND string $206_1$. It is common for two NAND strings to share the same drain contact.

Typical construction of floating gate transistors 208 includes a source 230 and a drain 232, a floating gate 234, and a control gate 236, as shown in FIG. 2. Floating gate transistors 208 have their control gates 236 coupled to a word line 202. A column of memory array includes a source select gate 210, a drain select gate 212, and a NAND string 206 of memory cells 208 coupled therebetween and thereby coupled to a given local bit line 204. A row of the floating gate transistors 208 are those transistors commonly coupled to a given word line 202.

Note that although a separate source line 216 is formed in each sector 203, drain select line 215, source select line 214, and the word lines 208 are common to each of sectors 203. That is, drain select gates 212 of the respective sectors 203 are commonly coupled to drain select line 215; source select gates 210 of the respective sectors 203 are commonly coupled to source select line 214; and the memory cells 208 of corresponding rows of memory cells 208 of the respective sectors 203 are commonly coupled to a word line 202.

Figure 3:
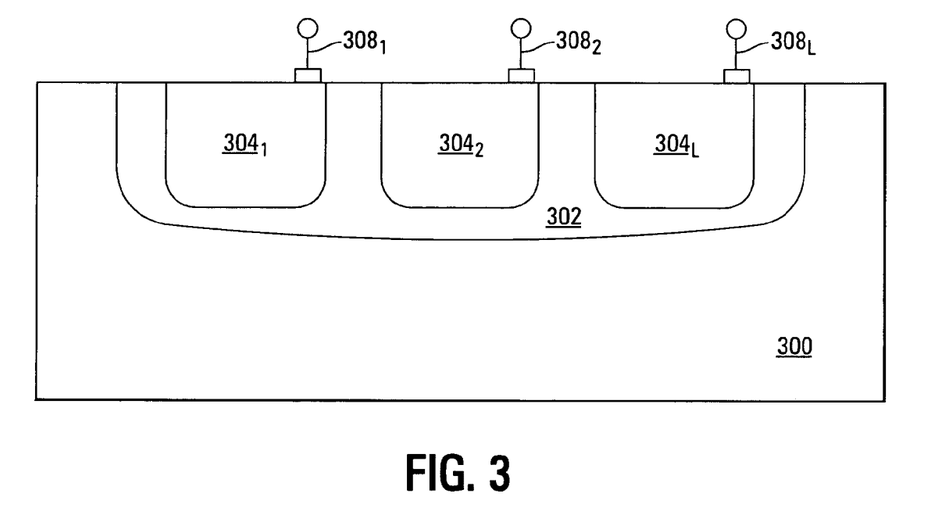
FIG. 3 is a cross-sectional view of a structure suitable for use in fabricating a memory array, according to another embodiment of the invention.

FIG. 3 is a cross-sectional view of a structure suitable for use in fabricating a memory array, such as memory array 200 of FIG. 2, according to another embodiment of the invention. Formation of such structures is well understood in the arts and will not be detailed herein. A substrate 300 has a first conductivity type, e.g., a p-type conductivity. Substrate 300 includes a well region 302 as a semiconductor region having a second conductivity type different from the first conductivity type. For example, the second conductivity type may be opposite the first conductivity type, e.g., an n-type conductivity opposite the p-type conductivity. Well region 302 may be formed in substrate 300 through such processing methods as doping a portion of substrate 300 to the appropriate conductivity by implantation or diffusion of dopant ions. Substrate 300 further includes well regions 304 as semiconductor regions having the first conductivity type. Each well region 304 may be formed in well region 302. For example, well regions 304 may be formed, for one embodiment, by forming a mask layer (not shown) overlying well region 302, subsequently patterning the mask layer for exposing portions of well region 302 corresponding to the future well regions 304, and doping the exposed regions with the appropriate dopant ions.

Each well region 304 is electrically isolated from other portions of the substrate 300 having the first conductivity type and from each other by the well region 302. Well region 302 is interposed between substrate 300 and well region 304. Well regions $304_1$-$304_L$ respectively have one or more contacts $308_1$-$308_L$ for coupling to other potential nodes.

For one embodiment, the structure of FIG. 3 may include an n-well as well region 302 formed in a p-type substrate as the substrate 300. P-wells may be formed in the n-well as the respective well regions 304. Note that well regions 304 are separated from each other as well as other areas of substrate 300 having the same conductivity type by an interposing region of the different conductivity type, e.g., well region 302.

Note that FIG. 3 is along a row direction of a memory array, such as memory array 200 of FIG. 2. Therefore, columns of memory cells run perpendicular to the drawing of FIG. 3. Memory sectors, such as memory sectors $203_1$-$203_L$ of FIG. 2, respectively include well regions $304_1$-$304_L$. Source and drain regions of the memory cells, e.g., source regions 230 and drain regions 232 of memory cells 208 of FIG. 2, are formed in well regions 304, and gate stacks of memory cells 208, e.g., including floating gates 234 and control gates 236 of FIG. 2, are formed on well regions 304. Well regions 304 form the channel regions of the memory cells for one embodiment, as is known in the art. Note further that a source line, such as a source line 216 of FIG. 2, is formed in each of well regions 304 and that the source lines respectively formed in well regions 304 are electrically isolated from each other.

One or more target memory cells 208, e.g., circled memory cell $208_1$ of FIG. 2, corresponding to a selected word line 202, e.g., word line $202_1$ of FIG. 2, and formed in a memory sector 203, e.g., memory sector $203_1$ of FIG. 2, may be programmed according to the following example for one embodiment: To program targeted memory cell $208_1$ a programming voltage $WL_S$, e.g., about 20 volts, is applied to selected word line $202_1$, and a pass voltage $WL_{US}$, e.g., about 10 volts, is applied to the remaining (or unselected) word lines not coupled to target memory cell $208_1$. The pass voltage $WL_{US}$ is not sufficient for programming the memory cells and has the effect of turning the memory cells of the unselected word lines to an ON condition, regardless of the programmed state of their internal floating gate. Turning the memory cells of the unselected word lines to an ON condition allows them to pass a bit line voltage $BL_1$, e.g., Vss or about zero volts, of the bit line, e.g., bit line $204_1$, coupled to the NAND string, e.g., NAND string $206_1$, that includes target memory cell $208_1$.

In addition, a voltage SG(D), e.g., about 1 volt, is applied to drain select line 215 and thus to the control gates of each of drain select gates 212. A voltage SG(S), e.g., Vss or about zero volts, is applied to source select line 214 and thus to the control gates of each of source select gates 210. An inhibit voltage BL, such as Vcc, e.g., about 1.8 volts, is applied to the bit lines, e.g., bit lines $204_2$ to $204_M$, respectively coupled to the NAND strings not including target memory cell $208_1$. Inhibit voltage BL acts prevent programming of untargeted memory cells of the selected word line to keep them in an erased state and thus leave them unchanged, e.g., at a logic high. A voltage SL(1), such as Vcc, e.g., about 1.8 volts, is applied to source line $216_1$, of sector $203_1$. Optionally, voltages SL(2) to SL(L), such as Vcc, e.g., about 1.8 volts, may applied to the remaining source lines, e.g., source lines $216_2$ to $216_L$ respectively of sectors $203_2$ to $203_L$, for one embodiment.

Note that an inherent boosting of the channel voltage of the untargeted memory cells occurs when a voltage, such as programming voltage $WL_S$ or pass voltage $WL_{US}$, is applied to the word lines and when an inhibit voltage BL is applied to the bit lines coupled to the NAND strings not including memory cells targeted for programming. For example, the voltage of the channel voltage of the untargeted memory cells may be boosted to about 30 percent of the difference between a voltage (programming or pass voltage) applied to a word line and a voltage applied to the wells 304 (FIG. 3) corresponding to the sectors 203 that do not include any targeted memory cells 208.

For some conventional programming operations, the difference between the word line voltage (programming or pass voltage) and the channel voltage is sufficiently high to partially program the untargeted memory cells. Successive applications of the word line voltage may also have a cumulative effect in that each application partially programs the untargeted memory cells until they become fully programmed. Note that the difference between a programming voltage applied to selected word lines and a channel voltage of untargeted memory cells coupled to the selected word lines is often referred to as a programming-voltage disturbance (or stress) that acts to disturb the threshold voltages Vts of the untargeted memory cells. The difference between a pass voltage applied to unselected word lines and a channel voltage of the memory cells coupled to the unselected word lines is often referred to as a pass-voltage disturbance (or stress) that acts to disturb the threshold voltages Vts of the memory cells.

To reduce the likelihood of partially or fully programming untargeted memory cells coupled to selected and unselected word lines, e.g., to reduce the programming- and pass-voltage disturbances, a voltage is applied to wells $304_2$ to $304_L$ (FIG. 3) respectively corresponding to sectors $203_2$ to $203_L$ that do not include any targeted memory cells. When a voltage is applied to the word lines, the voltage of the channels of the untargeted memory cells of memory sectors $203_2$ to $203_L$ coupled to the word lines is boosted above the voltage applied to the corresponding wells $304_2$ to $304_L$ by a percentage of the difference between the voltage applied to the word lines and the voltage applied to a well. Note that inhibit voltage BL is applied to the NAND strings that include these memory cells.

For one embodiment, the voltage applied to wells $304_2$ to $304_L$ is substantially equal to the pass voltage pass voltage $WL_{US}$ applied to the unselected word lines. This acts to cause the voltage of the channels of the untargeted memory cells of memory sectors $203_2$ to $203_L$ to be substantially the pass voltage $WL_{US}$ and thus acts to substantially eliminate the pass-voltage disturbance of the memory cells coupled to the unselected word lines. Moreover, the programming-voltage disturbance of the untargeted memory cells coupled to the selected word line is substantially reduced.

In one example, when a voltage applied to the wells $304_2$ to $304_L$ (FIG. 3), respectively corresponding to sectors $203_2$ to $203_L$ (FIG. 2) that do not include any targeted memory cells is substantially equal to the pass voltage $WL_{US}$ of about 10 volts applied to the unselected word lines, the difference between the pass voltage $WL_{US}$ applied to the unselected word lines and the channels of the untargeted memory cells of sectors $203_2$ to $203_L$ is substantially zero and the pass-voltage disturbance is substantially eliminated. Note that the NAND strings that include untargeted memory cells of sectors $203_2$ to $203_L$ are coupled to inhibit voltage BL.

With a programming voltage $WL_S$ of about 20 volts applied to selected word line $202_1$, the channels of the untargeted memory cells of sectors $203_2$ to $203_L$ coupled to selected word line $202_1$ get boosted to some fraction, e.g., about 30 percent, of the difference between programming voltage $WL_S$ and the voltage applied to wells $304_2$ to $304_L$, or to about 3 volts, above the voltage (10 volts) applied to wells $304_2$ to $304_L$, e.g., the channel voltage is about 13 volts. Therefore, the difference between the programming voltage $WL_S$ of about 20 volts and the channel voltage of about 13 volts is about 7 volts.

Note that when a well is grounded, as often occurs for conventional programming, the channel voltage is about 6 volts for 20 volts applied to a selected word line, and the difference between the programming voltage $WL_S$ of about 20 volts and the channel voltage of about 6 volts is about 14 volts. Therefore, applying a voltage to the wells corresponding to memory sectors having no targeted memory cells acts to substantially reduce the programming-voltage disturbance of these memory cells.

To erase selected memory cell $208_1$, the selected word line $202_1$ coupled to selected memory cell $208_1$ is grounded, and an erase voltage, e.g., substantially equal to the programming voltage $WL_S$, such as about 20 volts, is applied to the well $304_1$ (FIG. 3) corresponding to the memory sector $203_1$ that includes the selected memory cell $208_1$. The erase voltage is applied to the remaining (or unselected) word lines, and for one embodiment, a voltage, e.g., substantially equal to the pass voltage $WL_{US}$, such as about 10 volts, is applied to the wells 304 (FIG. 3) corresponding to the memory sectors 203 that do not include any the selected memory cells.

Figure 4:
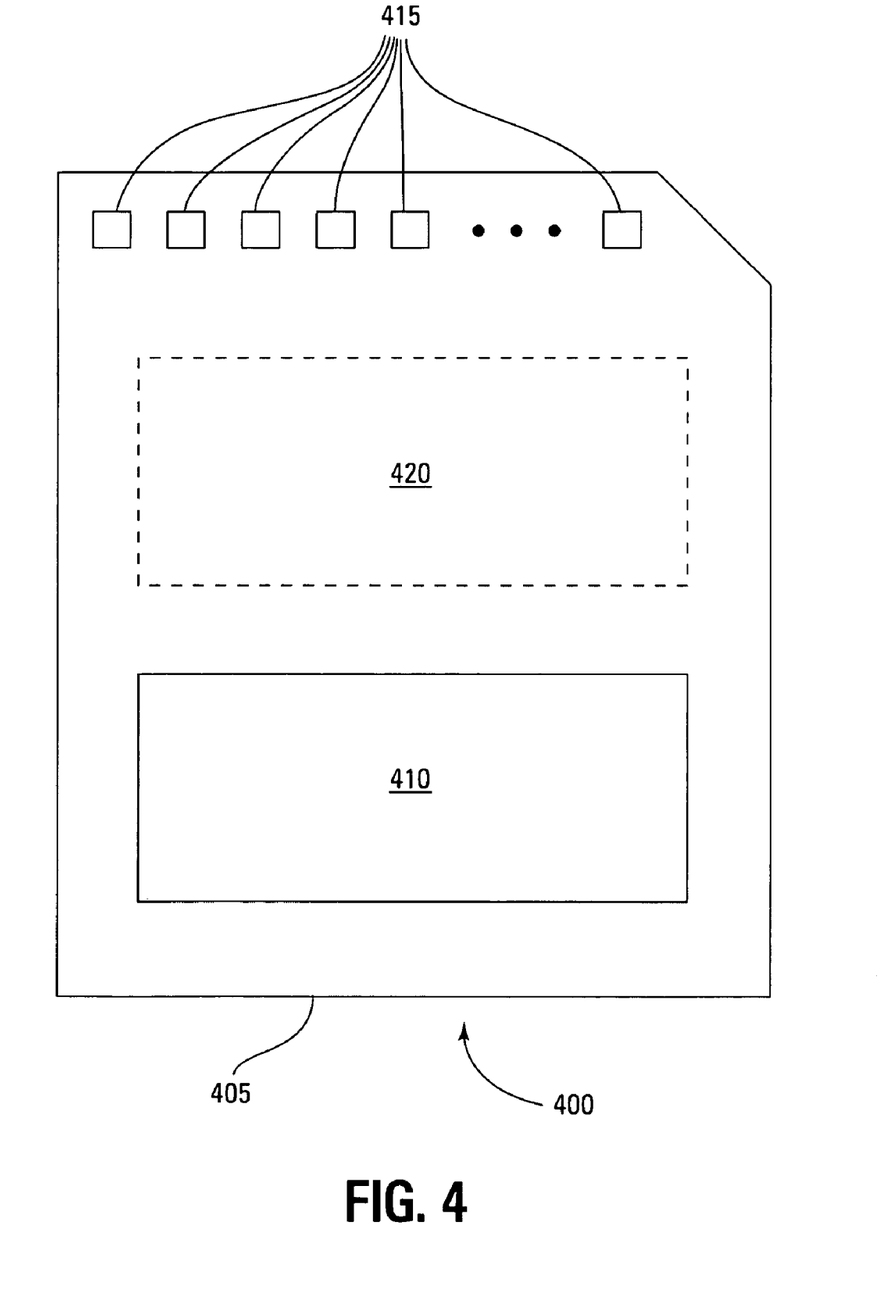
FIG. 4 is an illustration of an exemplary memory module.

FIG. 4 is an illustration of an exemplary memory module 400. Memory module 400 is illustrated as a memory card, although the concepts discussed with reference to memory module 400 are applicable to other types of removable or portable memory, e.g., USB flash drives, and are intended to be within the scope of "memory module" as used herein. In addition, although one example form factor is depicted in FIG. 4, these concepts are applicable to other form factors as well.

In some embodiments, memory module 400 will include a housing 405 (as depicted) to enclose one or more memory devices 410, though such a housing is not essential to all devices or device applications. At least one memory device 410 may be a NAND flash memory device having a memory array formed in accordance with the methods of the invention. At least one memory device 410 includes isolation regions formed in accordance with the invention. Where present, the housing 405 includes one or more contacts 415 for communication with a host device. Examples of host devices include digital cameras, digital recording and playback devices, PDAs, personal computers, memory card readers, interface hubs and the like. For some embodiments, the contacts 415 are in the form of a standardized interface. For example, with a USB flash drive, the contacts 415 might be in the form of a USB Type-A male connector. For some embodiments, the contacts 415 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 415 provide an interface for passing control, address and/or data signals between the memory module 400 and a host having compatible receptors for the contacts 415.

The memory module 400 may optionally include additional circuitry 420 which may be one or more integrated circuits and/or discrete components. For some embodiments, the additional circuitry 420 may include a memory controller for controlling access across multiple memory devices 410 and/or for providing a translation layer between an external host and a memory device 410. For example, there may not be a one-to-one correspondence between the number of contacts 415 and a number of I/O connections to the one or more memory devices 410. Thus, a memory controller could selectively couple an I/O connection (not shown in FIG. 4) of a memory device 410 to receive the appropriate signal at the appropriate I/O connection at the appropriate time or to provide the appropriate signal at the appropriate contact 415 at the appropriate time. Similarly, the communication protocol between a host and the memory module 400 may be different than what is required for access of a memory device 410. A memory controller could then translate the command sequences received from a host into the appropriate command sequences to achieve the desired access to the memory device 410. Such translation may further include changes in signal voltage levels in addition to command sequences.

The additional circuitry 420 may further include functionality unrelated to control of a memory device 410 such as logic functions as might be performed by an ASIC (application specific integrated circuit). Also, the additional circuitry 420 may include circuitry to restrict read or write access to the memory module 400, such as password protection, biometrics or the like. The additional circuitry 420 may include circuitry to indicate a status of the memory module 400. For example, the additional circuitry 420 may include functionality to determine whether power is being supplied to the memory module 400 and whether the memory module 400 is currently being accessed, and to display an indication of its status, such as a solid light while powered and a flashing light while being accessed. The additional circuitry 420 may further include passive devices, such as decoupling capacitors to help regulate power requirements within the memory module 400.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory array, comprising:
   a first well region having a first conductivity type;
   a plurality of second well regions of a second conductivity type formed in the first well region, the second well regions electrically isolated from each other; and
   a plurality of memory cells, arranged in row and column fashion, formed on each second well region, wherein corresponding rows of memory cells of the respective second well regions are commonly coupled to a word line, at least one of the second well regions having at least two memory cells of a row of memory cells coupleable to a single word line.

2. The memory array of claim 1, wherein the first well region is formed in a substrate having the second conductivity type.

3. The memory array of claim 1 further comprises a source line formed in each of the second well regions and selectively coupled to the columns of memory cells of the respective one of the second well regions, the source lines of the respective second well regions electrically isolated form each other.

4. The memory array of claim 1 further comprises first and second select gates respectively coupled to opposing ends of each column of memory cells, wherein the first select gates of the respective second wells are commonly coupled to a first select line and the second select gates of the respective second wells are commonly coupled to a second select line.

5. The memory array of claim 1, wherein each column of memory cells formed on each second well region is a NAND string.

6. The memory array of claim 1, wherein the first conductivity type is an n-type conductivity and the second conductivity type is a p-type conductivity.

7. The memory array of claim 1, wherein the memory cells are non-volatile memory cells.

8. A memory array, comprising:
a substrate having a first conductivity type;
a first well region having a second conductivity type formed in the substrate;
a plurality of second well regions of the first conductivity type formed in the first well region, the second well regions electrically isolated from each other and the substrate; and
a plurality of memory cells, arranged in row and column fashion, formed on each second well region;
wherein corresponding rows of memory cells of the respective second well regions are commonly coupled to a word line;
wherein at least one of the second well regions has at least two memory cells of a row of memory cells coupleable to a single word line; and
wherein each column of memory cells formed on each second well region is selectively coupled between a bit line and a source line of the respective one of the second well regions, the source lines of the respective second well regions electrically isolated from each other.

9. The memory array of claim 8, wherein each column of memory cells is selectively coupled between the bit line and the source line of the respective one of the second well regions through a pair of select gates.

10. The memory array of claim 8, wherein each column of memory cells is a string of series connected memory cells.

11. The memory array of claim 8, wherein the first conductivity type is a p-type conductivity and the second conductivity type is an n-type conductivity.

12. A NAND memory array, comprising:
a substrate having a first conductivity type;
a first well region having a second conductivity type formed in the substrate;
a plurality of second well regions of the first conductivity type formed in the first well region, the second well regions electrically isolated from each other and the substrate; and
a plurality of memory cells, arranged in row and column fashion, formed on each second well region;
a plurality of word lines, each word line coupled to a row of memory cells in each second well region;
wherein at least one of the second well regions has at least two memory cells of a row of memory cells coupleable to a single word line;
wherein each column of memory cells formed on each second well region is a string of floating-gate memory cells connected in series between a source select gate and a drain select gate, the source select gates forming a row of source select gates of the respective second well regions commonly coupled to a source select line, the drain select gates forming a row of drain select gates of the respective second well regions commonly coupled to a drain select line;
wherein each source select gate selectively couples a corresponding string of floating-gate memory cells to a source line of the respective one of the second well regions, the source lines of the respective second well regions electrically isolated from each other; and
wherein each drain select gate selectively couples a corresponding string of floating-gate memory cells to a corresponding bit line.

13. A NAND memory array, comprising:
a substrate having a p-type conductivity;
a first well region having an n-type conductivity formed in the substrate;
a plurality of second well regions having the p-type conductivity formed in the first well region, the second well regions electrically isolated from each other and the substrate; and
a plurality of memory cells, arranged in row and column fashion, formed on each second well region;
wherein corresponding rows of memory cells of the respective second well regions are configured to receive the same gate voltage;
wherein at least one of the second well regions has at least two memory cells of a row of memory cells coupleable to receive the same gate voltage;
wherein each column of memory cells formed on each second well region is a string of floating-gate memory cells connected in series between a source select gate and a drain select gate, the source select gates forming a row of source select gates of the respective second well regions commonly coupled to a source select line, the drain select gates forming a row of drain select gates of the respective second well regions commonly coupled to a drain select line;
wherein each source select gate selectively couples a corresponding string of floating-gate memory cells to a source line of the respective one of the second well regions, the source lines of the respective second well regions electrically isolated from each other; and
wherein each drain select gate selectively couples a corresponding string of floating-gate memory cells to a bit line of the respective one of the second well regions.

14. A memory module, comprising:
a plurality of contacts; and
two or more memory devices, each having access lines selectively coupled to the plurality of contacts;
wherein at least one of the memory devices comprises a memory array, comprising:
a first well region having a first conductivity type;
a plurality of second well regions of a second conductivity type formed in the first well region, the second well regions electrically isolated from each other; and
a plurality of memory cells, arranged in row and column fashion, formed on each second well region, wherein corresponding rows of memory cells of the respective second well regions are commonly coupled to a word line, at least one of the second well regions having at least two memory cells of a row of memory cells coupleable to a single word line.

15. A memory module, comprising:
a plurality of contacts; and
two or more memory devices, each having access lines selectively coupled to the plurality of contacts;
wherein at least one of the memory devices comprises a memory array, comprising:
   a substrate having a first conductivity type;
   a first well region having a second conductivity type formed in the substrate;
   a plurality of second well regions of the first conductivity type formed in the first well region, the second well regions electrically isolated from each other and the substrate; and
   a plurality of memory cells, arranged in row and column fashion, formed on each second well region;
   wherein corresponding rows of memory cells of the respective second well regions are commonly coupled to a word line;
   wherein at least one of the second well regions has at least two memory cells of a row of memory cells coupleable to a single word line; and
   wherein each column of memory cells formed on each second well region is selectively coupled between a bit line and a source line of the respective one of the second well regions, the source lines of the respective second well regions electrically isolated from each other.

16. A memory module, comprising:
a plurality of contacts; and
two or more memory devices, each having access lines selectively coupled to the plurality of contacts;
wherein at least one of the memory devices comprises a NAND memory array, comprising:
   a substrate having a first conductivity type;
   a first well region having a second conductivity type formed in the substrate;
   a plurality of second well regions of the first conductivity type formed in the first well region, the second well regions electrically isolated from each other and the substrate; and
   a plurality of memory cells, arranged in row and column fashion, formed on each second well region;
   a plurality of word lines, each word line coupled to a row of memory cells in each second well region;
   wherein at least one of the second well regions has at least two memory cells of a row of memory cells coupleable to a single word line;
   wherein each column of memory cells formed on each second well region is a string of floating-gate memory cells connected in series between a source select gate and a drain select gate, the source select gates forming a row of source select gates of the respective second well regions commonly coupled to a source select line, the drain select gates forming a row of drain select gates of the respective second well regions commonly coupled to a drain select line;
   wherein each source select gate selectively couples a corresponding string of floating-gate memory cells to a source line of the respective one of the second well regions, the source lines of the respective second well regions electrically isolated from each other; and
   wherein each drain select gate selectively couples a corresponding string of floating-gate memory cells to a bit line of the respective one of the second well regions.

17. A memory module, comprising:
a plurality of contacts; and
two or more memory devices, each having access lines selectively coupled to the plurality of contacts;
wherein at least one of the memory devices comprises a NAND memory array, comprising:
   a substrate having a p-type conductivity;
   a first well region having an n-type conductivity formed in the substrate;
   a plurality of second well regions having the p-type conductivity formed in the first well region, the second well regions electrically isolated from each other and the substrate; and
   a plurality of memory cells, arranged in row and column fashion, formed on each second well region;
   wherein corresponding rows of memory cells of the respective second well regions are configured to receive the same gate voltage;
   wherein at least one of the second well regions has at least two memory cells of a row of memory cells coupleable to receive the same gate voltage;
   wherein each column of memory cells formed on each second well region is a string of floating-gate memory cells connected in series between a source select gate and a drain select gate, the source select gates forming a row of source select gates of the respective second well regions commonly coupled to a source select line, the drain select gates forming a row of drain select gates of the respective second well regions commonly coupled to a drain select line;
   wherein each source select gate selectively couples a corresponding string of floating-gate memory cells to a source line of the respective one of the second well regions, the source lines of the respective second well regions electrically isolated from each other; and
   wherein each drain select gate selectively couples a corresponding string of floating-gate memory cells to a bit line of the respective one of the second well regions.

18. A memory module, comprising:
a housing having a plurality of contacts; and
one or more memory devices enclosed in the housing and selectively coupled to the plurality of contacts;
wherein at least one of the memory devices comprises a memory array, comprising:
   a first well region having a first conductivity type;
   a plurality of second well regions of a second conductivity type formed in the first well region, the second well regions electrically isolated from each other; and
   a plurality of memory cells, arranged in row and column fashion, formed on each second well region, wherein corresponding rows of memory cells of the respective second well regions are commonly coupled to a word line, at least one of the second well regions having at least two memory cells of a row of memory cells coupleable to a single word line.

19. A memory module, comprising:
a housing having a plurality of contacts; and
one or more memory devices enclosed in the housing and selectively coupled to the plurality of contacts;
wherein at least one of the memory devices comprises a memory array, comprising:
   a substrate having a first conductivity type;

a first well region having a second conductivity type formed in the substrate;

a plurality of second well regions of the first conductivity type formed in the first well region, the second well regions electrically isolated from each other and the substrate; and a plurality of memory cells, arranged in row and column fashion, formed on each second well region;

wherein corresponding rows of memory cells of the respective second well regions are commonly coupled to a word line;

wherein at least one of the second well regions has at least two memory cells of a row of memory cells coupleable to a single word line; and wherein each column of memory cells formed on each second well region is selectively coupled between a bit line and a source line of the respective one of the second well regions, the source lines of the respective second well regions electrically isolated from each other.

20. A memory module, comprising:

a housing having a plurality of contacts; and one or more memory devices enclosed in the housing and selectively coupled to the plurality of contacts;

wherein at least one of the memory devices comprises a NAND memory array, comprising:

a substrate having a first conductivity type;

a first well region having a second conductivity type formed in the substrate;

a plurality of second well regions of the first conductivity type formed in the first well region, the second well regions electrically isolated from each other; and a plurality of memory cells, arranged in row and column fashion, formed on each second well region;

a plurality of word lines, each word line coupled to a row of memory cells in each second well region;

wherein at least one of the second well regions has at least two memory cells of a row of memory cells coupleable to a single word line;

wherein each column of memory cells formed on each second well region is a string of floating-gate memory cells connected in series between a source select gate and a drain select gate, the source select gates forming a row of source select gates of the respective second well regions commonly coupled to a source select line, the drain select gates forming a row of drain select gates of the respective second well regions commonly coupled to a drain select line;

wherein each source select gate selectively couples a corresponding string of floating-gate memory cells to a source line of the respective one of the second well regions, the source lines of the respective second well regions electrically isolated from each other; and wherein each drain select gate selectively couples a corresponding string of floating-gate memory cells to a bit line of the respective one of the second well regions.

21. A memory module, comprising:

a housing having a plurality of contacts; and one or more memory devices enclosed in the housing and selectively coupled to the plurality of contacts;

wherein at least one of the memory devices comprises a NAND memory array, comprising:

a substrate having a p-type conductivity;

a first well region having an n-type conductivity formed in the substrate;

a plurality of second well regions having the p-type conductivity formed in the first well region, the second well regions electrically isolated from each other and the substrate; and a plurality of memory cells, arranged in row and column fashion, formed on each second well region;

wherein corresponding rows of memory cells of the respective second well regions are configured to receive the same gate voltage;

wherein at least one of the second well regions has at least two memory cells of a row of memory cells coupleable to receive the same gate voltage;

wherein each column of memory cells formed on each second well region is a string of floating-gate memory cells connected in series between a source select gate and a drain select gate, the source select gates forming a row of source select gates of the respective second well regions commonly coupled to a source select line, the drain select gates forming a row of drain select gates of the respective second well regions commonly coupled to a drain select line;

wherein each source select gate selectively couples a corresponding string of floating-gate memory cells to a source line of the respective one of the second well regions, the source lines of the respective second well regions electrically isolated from each other; and wherein each drain select gate selectively couples a corresponding string of floating-gate memory cells to a bit line of the respective one of the second well regions.

22. An electronic system, comprising:

a processor; and one or more memory devices coupled to the processor, wherein at least one of the memory devices comprises a memory array, comprising:

a first well region having a first conductivity type;

a plurality of second well regions of a second conductivity type formed in the first well region, the second well regions electrically isolated from each other; and a plurality of memory cells, arranged in row and column fashion, formed on each second well region, wherein corresponding rows of memory cells of the respective second well regions are commonly coupled to a word line, at least one of the second well regions having at least two memory cells of a row of memory cells coupleable to a single word line.

23. An electronic system, comprising:

a processor; and one or more memory devices coupled to the processor, wherein at least one of the memory devices comprises a memory array, comprising:

a substrate having a first conductivity type;

a first well region having a second conductivity type formed in the substrate;

a plurality of second well regions of the first conductivity type formed in the first well region, the second well regions electrically isolated from each other and the substrate; and a plurality of memory cells, arranged in row and column fashion, formed on each second well region;

wherein corresponding rows of memory cells of the respective second well regions are commonly coupled to a word line;

wherein at least one of the second well regions has at least two memory cells of a row of memory cells coupleable to a single word line; and wherein each column of memory cells formed on each second well region is selectively coupled between a bit line and a source line of the respective one of the second well regions, the source lines of the respective second well regions electrically isolated from each other.

24. An electronic system, comprising:
a processor; and
one or more memory devices coupled to the processor, wherein at least one of the memory devices comprises a NAND memory array, comprising:
a substrate having a first conductivity type;
a first well region having a second conductivity type formed in the substrate;
a plurality of second well regions of the first conductivity type formed in the first well region, the second well regions electrically isolated from each other and the substrate; and
a plurality of memory cells, arranged in row and column fashion, formed on each second well region;
a plurality of word lines, each word line coupled to a row of memory cells in each second well region;
wherein at least one of the second well regions has at least two memory cells of a row of memory cells coupleable to a single word line;
wherein each column of memory cells formed on each second well region is a string of floating-gate memory cells connected in series between a source select gate and a drain select gate, the source select gates forming a row of source select gates of the respective second well regions commonly coupled to a source select line, the drain select gates forming a row of drain select gates of the respective second well regions commonly coupled to a drain select line;
wherein each source select gate selectively couples a corresponding string of floating-gate memory cells to a source line of the respective one of the second well regions, the source lines of the respective second well regions electrically isolated from each other; and
wherein each drain select gate selectively couples a corresponding string of floating-gate memory cells to a bit line of the respective one of the second well regions.

25. An electronic system, comprising:
a processor; and
one or more memory devices coupled to the processor, wherein at least one of the memory devices comprises a NAND memory array, comprising:
a substrate having a p-type conductivity;
a first well region having an n-type conductivity formed in the substrate;
a plurality of second well regions having the p-type conductivity formed in the first well region, the second well regions electrically isolated from each other and the substrate; and
a plurality of memory cells, arranged in row and column fashion, formed on each second well region;
wherein corresponding rows of memory cells of the respective second well regions are configured to receive the same gate voltage;
wherein at least one of the second well regions has at least two memory cells of a row of memory cells coupleable to receive the same gate voltage;
wherein each column of memory cells formed on each second well region is a string of floating-gate memory cells connected in series between a source select gate and a drain select gate, the source select gates forming a row of source select gates of the respective second well regions commonly coupled to a source select line, the drain select gates forming a row of drain select gates of the respective second well regions commonly coupled to a drain select line;
wherein each source select gate selectively couples a corresponding string of floating-gate memory cells to a source line of the respective one of the second well regions, the source lines of the respective second well regions electrically isolated from each other; and
wherein each drain select gate selectively couples a corresponding string of floating-gate memory cells to a bit line of the respective one of the second well regions.

26. A method of forming a memory array, comprising:
forming a first well region having a first conductivity type;
forming a plurality of second well regions of a second conductivity type in the first well region such that the second well regions are electrically isolated from each other;
forming a plurality of memory cells, arranged in row and column fashion, on each second well region;
commonly coupling corresponding rows of memory cells of the respective second well regions to a word line and
selectively coupling at least two memory cells of a row of memory cells of at least one of the second well regions to a single word line.

27. The method of claim 26 further comprises forming a source line in each of the second well regions and selectively coupling the source line to the columns of memory cells of the respective one of the second well regions, wherein the source lines of the respective second well regions are electrically isolated form each other.

28. The method of claim 26 further comprises forming first and second select gates respectively coupled to opposing ends of each column of memory cells commonly coupling the first select gates of the respective second wells to a first select line and commonly coupling the second select gates of the respective second wells to a second select line.

29. A method of forming a memory array, comprising:
forming a first well region having a first conductivity type in a substrate having a second conductivity type;
forming a plurality of second well regions of the second conductivity type in the first well region such that the second well regions are electrically isolated from each other and the substrate;
forming a plurality of memory cells, arranged in row and column fashion, on each second well region;
coupling corresponding rows of memory cells of the respective second well regions to receive the same gate voltage;
selectively coupling at least two memory cells of a row of memory cells of at least one of the second well regions to receive the same gate voltage;
forming source line in each of the second well regions such that the source lines of the respective second well regions are electrically isolated from each other; and
selectively coupling each column of memory cells formed on each second well region between a bit line and the source line of the respective one of the second well regions.

30. The method of claim 29, wherein forming a first well region having a first conductivity type comprises doping a portion of the substrate to have the first conductivity type.

31. The method of claim 29, wherein forming a plurality of second well regions of the second conductivity type in the first well region comprises doping portions of the first well region to have the second conductivity type.

32. A method of forming a NAND memory array, comprising:
- doping a portion of a substrate having a first conductivity to form a first well region having a second conductivity type in the substrate;
- doping a plurality of portions of the first well region to respectively form a plurality second well regions of the first conductivity type in the first well region, wherein the second well regions are electrically isolated from each other;
- forming a plurality floating-gate memory cells, arranged in row and column fashion, on each second well region such that each column of memory cells formed on each second well region is a string of floating-gate memory cells connected in series and corresponding rows of memory cells of the respective second well regions are commonly coupled to a word line, at least one of the second well regions having at least two memory cells of a row of memory cells coupleable to a single word line;
- forming a source select gate coupled to a first end of each string of series-connected floating-gate memory cells to form a row of source select gates such that the rows of source select gates of the respective second well regions are commonly coupled to a source select line;
- forming a drain select gate at a second end of each string of series-connected floating-gate memory cells to form a row of drain select gates such that the rows of drain select gates of the respective second well regions are commonly coupled to a drain select line;
- forming a source line in each of the second well regions such that the source lines of the respective second well regions are electrically isolated from each other and the source lines of the respective second well regions are respectively selectively coupled to the strings of floating-gate memory cells of the respective second well regions through the select gates respectively corresponding to the strings of floating-gate memory cells; and
- forming a plurality bit lines in each of the second well regions such that the bit lines of each of the second well regions are respectively selectively coupled to the strings of floating-gate memory cells of the corresponding second well region through the drain select gates of the corresponding second well region.

33. A method of forming a NAND memory array, comprising:
- doping a portion of a substrate having a p-type conductivity to form a first well region having an n-type conductivity in the substrate;
- doping a plurality of portions of the first well region to respectively form a plurality second well regions having the p-type conductivity in the first well region, wherein the second well regions are electrically isolated from each other;
- forming a plurality floating-gate memory cells, arranged in row and column fashion, on each second well region such that each column of memory cells formed on each second well region is a string of floating-gate memory cells connected in series and corresponding rows of memory cells of the respective second well regions are commonly coupled to a word line, at least one of the second well regions having at least two memory cells of a row of memory cells coupleable to a single word line;
- forming a source select gate coupled to a first end of each string of series-connected floating-gate memory cells to form a row of source select gates such that the rows of source select gates of the respective second well regions are commonly coupled to a source select line;
- forming a drain select gate at a second end of each string of series-connected floating-gate memory cells to form a row of drain select gates such that the rows of drain select gates of the respective second well regions are commonly coupled to a drain select line;
- forming source line in each of the second well regions such that the source lines of the respective second well regions are electrically isolated from each other and the source lines of the respective second well regions are respectively selectively coupled to the strings of floating-gate memory cells of the respective second well regions through the select gates respectively corresponding to the strings of floating-gate memory cells; and
- forming a plurality bit lines in each of the second well regions such that the bit lines of each of the second well regions are respectively selectively coupled to the strings of floating-gate memory cells of the corresponding second well region through the drain select gates of the corresponding second well region.

* * * * *

UNITED STATES PATENT AND TRADEMARK OFFICE
CERTIFICATE OF CORRECTION

| | | |
|---|---|---|
| PATENT NO. | : 7,616,489 B2 | Page 1 of 1 |
| APPLICATION NO. | : 11/349854 | |
| DATED | : November 10, 2009 | |
| INVENTOR(S) | : Aaron Yip | |

It is certified that error appears in the above-identified patent and that said Letters Patent is hereby corrected as shown below:

In column 17, line 9, in Claim 32, delete "plurality" and insert -- plurality of --, therefor.

In column 17, line 13, in Claim 32, delete "plurality" and insert -- plurality of --, therefor.

In column 17, line 41, in Claim 32, delete "plurality" and insert -- plurality of --, therefor.

In column 18, line 7, in Claim 33, delete "plurality" and insert -- plurality of --, therefor.

In column 18, line 11, in Claim 33, delete "plurality" and insert -- plurality of --, therefor.

In column 18, line 39, in Claim 33, delete "plurality" and insert -- plurality of --, therefor.

Signed and Sealed this

Nineteenth Day of January, 2010

David J. Kappos
*Director of the United States Patent and Trademark Office*

UNITED STATES PATENT AND TRADEMARK OFFICE
CERTIFICATE OF CORRECTION

PATENT NO. : 7,616,489 B2 Page 1 of 1
APPLICATION NO. : 11/349854
DATED : November 10, 2009
INVENTOR(S) : Aaron Yip It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 596 days.

Signed and Sealed this

Fourteenth Day of December, 2010

David J. Kappos
*Director of the United States Patent and Trademark Office*